(12) United States Patent
Dodworth

(10) Patent No.: US 11,363,243 B2
(45) Date of Patent: Jun. 14, 2022

(54) LASER ARRAYS

(71) Applicant: LIGHTWAVE INTERNATIONAL, INC., Eighty Four, PA (US)

(72) Inventor: George Dodworth, Eighty Four, PA (US)

(73) Assignee: LIGHTWAVE INTERNATIONAL, INC., Eighty Four, PA (US)

( * ) Notice: Subject to any disclaimer, the term of this patent is extended or adjusted under 35 U.S.C. 154(b) by 0 days.

(21) Appl. No.: 15/127,778

(22) PCT Filed: Mar. 23, 2015

(86) PCT No.: PCT/US2015/022072
§ 371 (c)(1),
(2) Date: Sep. 20, 2016

(87) PCT Pub. No.: WO2015/143450
PCT Pub. Date: Sep. 24, 2015

(65) Prior Publication Data
US 2017/0099470 A1    Apr. 6, 2017

Related U.S. Application Data

(60) Provisional application No. 61/968,812, filed on Mar. 21, 2014.

(51) Int. Cl.
*H04N 9/31* (2006.01)
*H01S 5/40* (2006.01)
*G09F 9/33* (2006.01)
(Continued)

(52) U.S. Cl.
CPC ............. *H04N 9/3164* (2013.01); *G09F 9/33* (2013.01); *G09F 19/18* (2013.01); *H01S 5/4093* (2013.01);
(Continued)

(58) Field of Classification Search
CPC .. H04N 9/3164; H04N 9/3161; H04N 9/3155; H04N 9/3123; H04N 9/3138; H04N 9/31–3197; G03B 21/2053; G03B 21/206; G03B 21/2013; G03B 21/2033; G03B 21/2006; G03B 21/00–64; G09F 9/33; G09F 19/18; G09F 9/00–46; G02B 27/01–0189; G02B 2027/0105–0198; F21S 10/023; F21Y 2105/10; F21Y 2105/12; F21Y 2113/13; H01L 25/00–50; H01L 27/00–3293
See application file for complete search history.

(56) References Cited

U.S. PATENT DOCUMENTS 7,893,948 B1     2/2011   Mittan et al.
2003/0058191 A1  3/2003   Yuhara et al.
(Continued)

OTHER PUBLICATIONS

Supplemental Search Report for European Application No. 15765929.3 dated Oct. 19, 2017.

*Primary Examiner* — Michelle M Iacoletti
*Assistant Examiner* — Christopher A Lamb, II
(74) *Attorney, Agent, or Firm* — Michael G. Monyok

(57) ABSTRACT

Disclosed herein are a plurality of laser sources forming an element. Multiple laser elements are arranged in a pattern to form an array. Each laser element of the array is independently addressable, such that video and other content can be projected from the array.

16 Claims, 12 Drawing Sheets

(51) Int. Cl.
*G09F 19/18* (2006.01)
*H04N 13/388* (2018.01)
*H05B 47/155* (2020.01)

(52) U.S. Cl.
CPC ......... *H04N 9/3138* (2013.01); *H04N 9/3155* (2013.01); *H04N 9/3161* (2013.01); *H04N 13/388* (2018.05); *H05B 47/155* (2020.01)

(56) References Cited

U.S. PATENT DOCUMENTS

| | | | | |
|---|---|---|---|---|
| 2003/0206145 | A1* | 11/2003 | Spoonhower | H04N 9/3129 345/84 |
| 2007/0297750 | A1* | 12/2007 | Bass | G02B 27/017 385/147 |
| 2010/0328610 | A1* | 12/2010 | Silverstein | G03B 35/26 353/7 |
| 2011/0063574 | A1* | 3/2011 | Freeman | G02B 27/2207 353/7 |
| 2011/0148328 | A1 | 6/2011 | Joseph et al. | |
| 2011/0149251 | A1* | 6/2011 | Duelli | G02B 27/48 353/38 |
| 2011/0279880 | A1* | 11/2011 | Benner, Jr. | H04N 9/3129 359/205.1 |
| 2011/0298692 | A1 | 12/2011 | De Loore et al. | |
| 2012/0032598 | A1* | 2/2012 | Shioiri | G03B 21/2033 315/121 |
| 2012/0038892 | A1* | 2/2012 | Kurtz | H04N 9/3105 353/31 |
| 2012/0099084 | A1* | 4/2012 | Toyooka | G03B 21/14 353/85 |
| 2012/0299801 | A1* | 11/2012 | Kitano | F21V 5/007 345/32 |
| 2012/0320355 | A1* | 12/2012 | Maeda | G03B 21/2013 355/67 |
| 2013/0076800 | A1* | 3/2013 | Hatagi | H04N 9/3129 345/690 |
| 2013/0169701 | A1* | 7/2013 | Whitehead | H04N 9/3102 345/690 |

* cited by examiner

LASER ARRAYS

CROSS-REFERENCE TO RELATED APPLICATIONS

This application claims the benefit under 35 U.S.C. § 119 of U.S. Provisional Application Ser. No. 61/968,812, filed on Mar. 21, 2014, which is incorporated by reference herein in its entirety.

STATEMENT REGARDING FEDERALLY SPONSORED RESEARCH

Not applicable.

BACKGROUND OF THE INVENTION

The field of the invention relates generally to laser lighting sources. More specifically, the invention relates to a system and method of using lasers in an array as a replacement for conventional lighting sources and to create unique visual presentations.

Traditional lighting sources have long been placed in arrangements to create arrays of lights. A video screen comprised of individual filament bulbs is one example of a lighting array. With independent control of each bulb, the array can be addressed to visualize information. The quality of the array can be improved by adding multiple colors and increasing the resolution. However, traditional lighting sources generally present information as an on-or-off state. Thus, the array is limited to a 2-dimensional display of colors.

Laser lighting is a promising illumination source due to its increased directionality, higher power densities, beam shaping without the use of a global lens element, and ability to be designed with discrete light properties (i.e. wavelength, power, irradiance, coherence, polarization, divergence, and directionality). With control over the discrete properties of laser light, more information can be provided than simply on-or-off. In addition, lasers with low divergence can present three dimensional shapes. However, laser lighting has not been widely adopted for use as direct lighting sources due to the current technological limitations of lasers and the concerns for eye safety. As such, the benefits associated with laser lights are not realized. Therefore, it would be advantageous to develop a laser array that can be used as a replacement for traditional bulbs, illumination sources, and even pixels used in displays.

SUMMARY OF THE INVENTION

The present invention uses a laser array as a light source. The laser array can be used much like traditional lighting sources are used and can even be used to replace pixels in video screens.

The benefits of the direct laser light source of the present invention include: (1) direct beam shaping by array; (2) incredibly sharp, focusable beam (3) more directional than other existing light sources; (4) highest potential irradiance of any light source; and (5) more efficient than LED light sources due to elimination of lossy reflectors. The lasers in the array can output light directly or through optics.

DETAILED DESCRIPTION OF THE INVENTION

Figure 1:
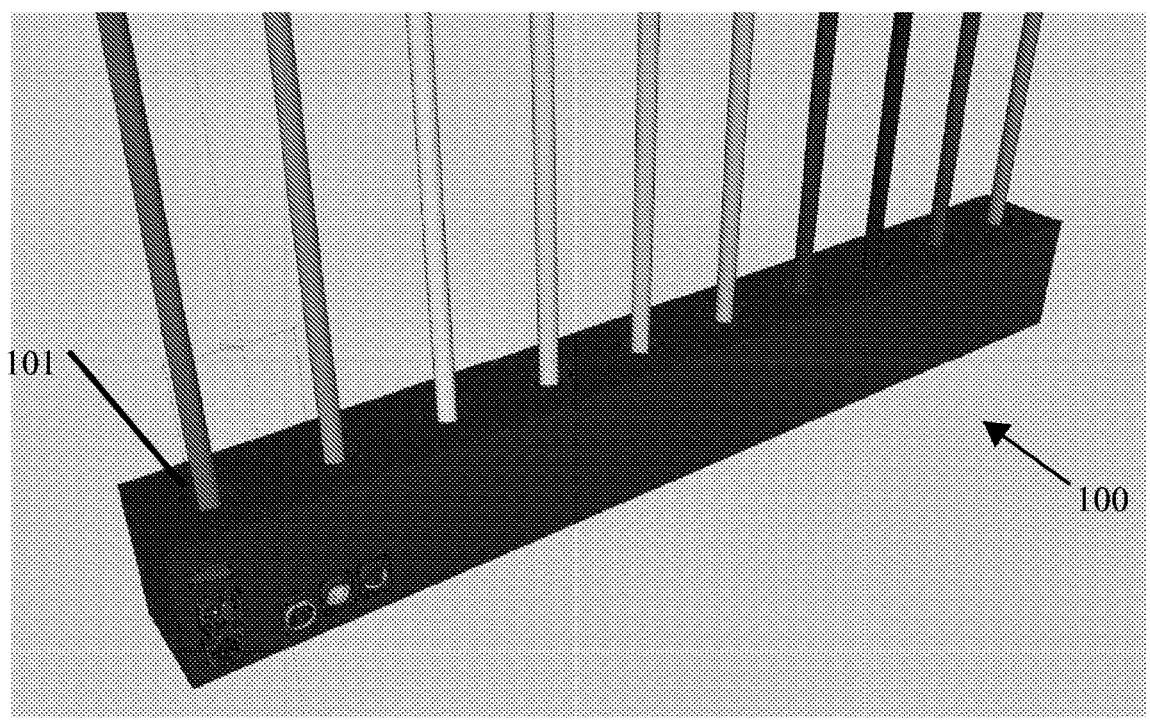
FIG. 1 shows a linear array of lasers, according to one embodiment of the present invention.

Described herein is an array 100 of lasers that can be used in various settings. FIG. 1 depicts a simple linear array of lasers elements 101. In this particular example, ten individual laser elements 101 are separated by a distance of 100 mm. In the preferred embodiment, the laser element 101 comprises red, green, and blue laser diode laser sources 102 which are combined into a collinear beam. However, any type of laser known in the art can be used. The operator has independent control of the intensity of each color of the sources 102 of each element 101 in the array 100, allowing the operator or control system to display any color. The color information can be changed at fast visual rates ranging from 0 Hz to 100 KHz, for example, allowing the display of content such as video. The array 100 is controlled by a standard lighting control protocol, such as DMX, with each laser element 101, comprised of one or multiple sources 102, that is part of the array 100 controlled independently.

Figure 2:
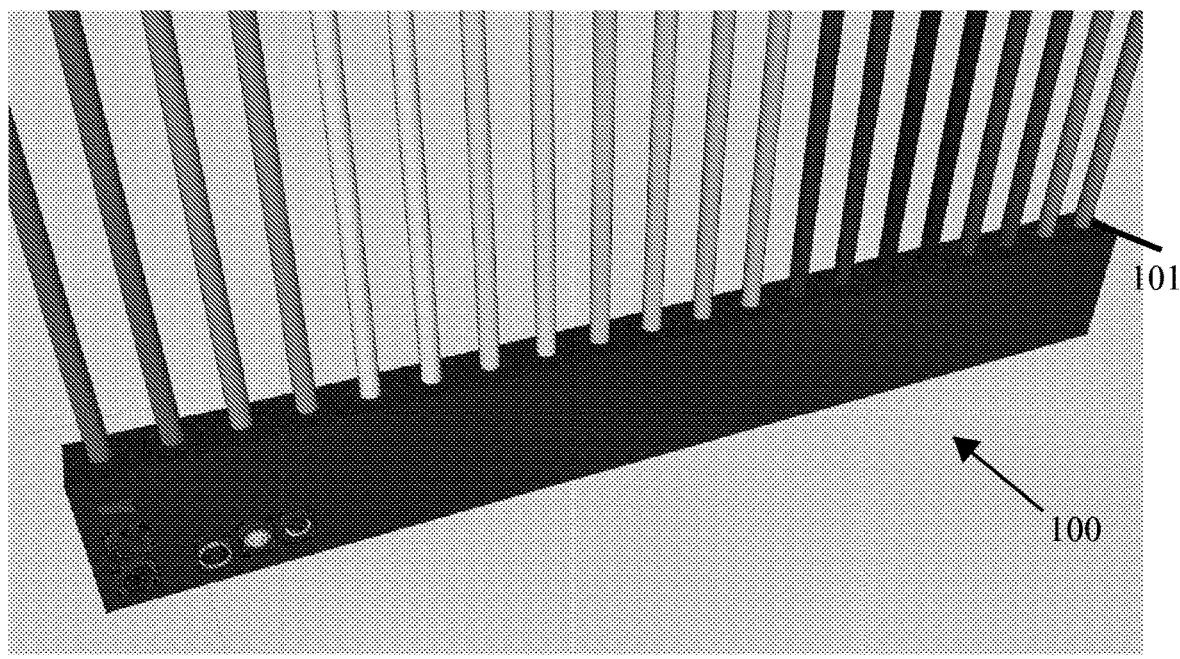
FIG. 2 shows a larger linear array of lasers with reduced separation between individual lasers.

FIG. 2 is an alternative embodiment of the laser array 100. In this embodiment, the array 100 is comprised of twenty separate laser elements 101, each separated by a distance of 50 mm. The array 100 in FIG. 2 has a much smaller pitch, or spacing between elements 101, than the array in FIG. 1.

Figure 3:
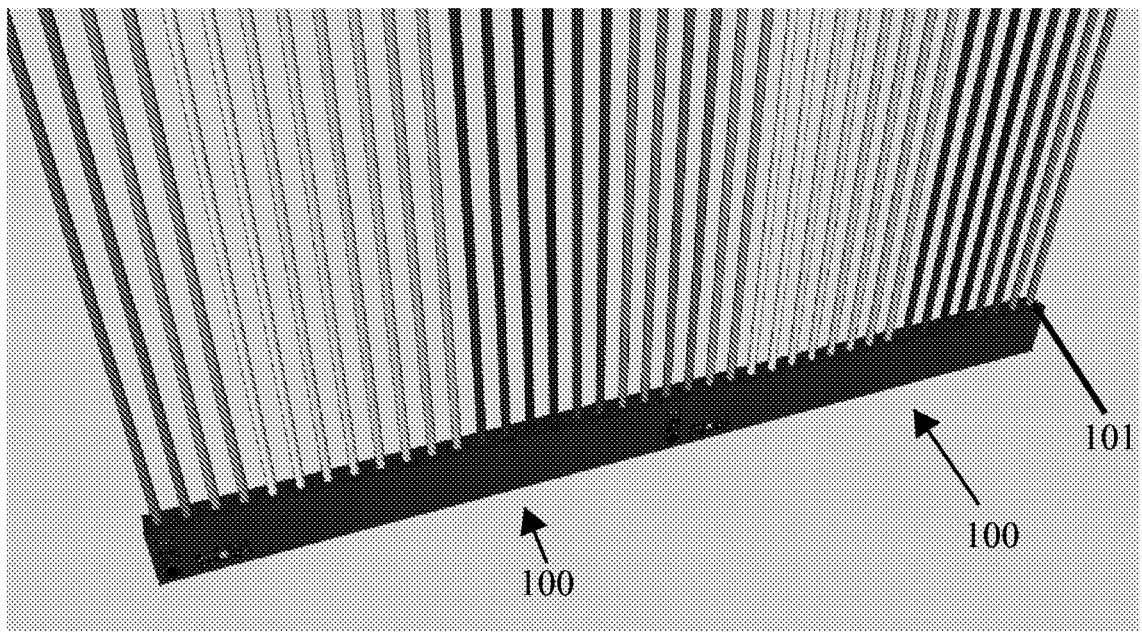
FIG. 3 shows a linear array that is a combination of two shorter arrays.
Figure 4:
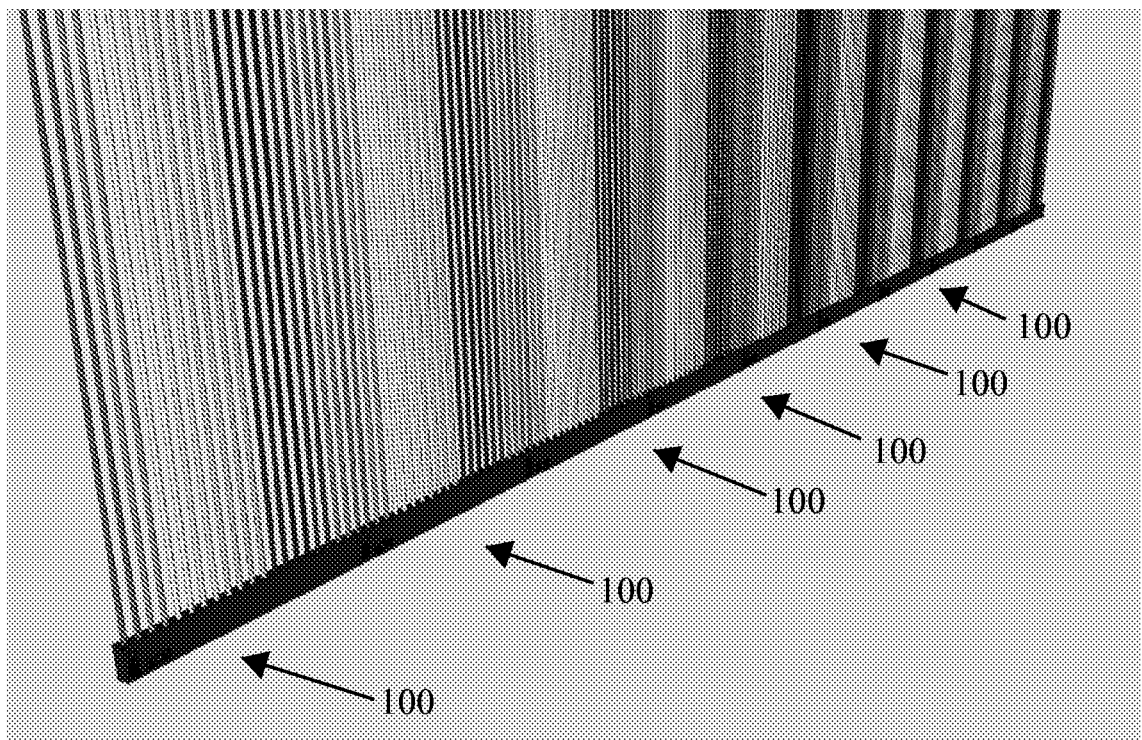
FIG. 4 shows a linear array that is a combination of multiple arrays, stacked end-to-end.

FIG. 3 shows two arrays 100 joined end-to-end. The DMX control and power supplies can be daisy chained between each individual array 100. A communication port, such as ArtNet, is also included. A simple video can be mapped to the laser elements 101 with the included communication and control interfaces 103. FIG. 4 shows yet another embodiment of the laser array 100, with multiple smaller arrays 100 joined together. An array 100 of this pitch could be used for stage lighting effects, video, commercial displays and research, for example. Again, any color could be specified for each individual laser element 101 that makes up the array 100.

Figure 5:
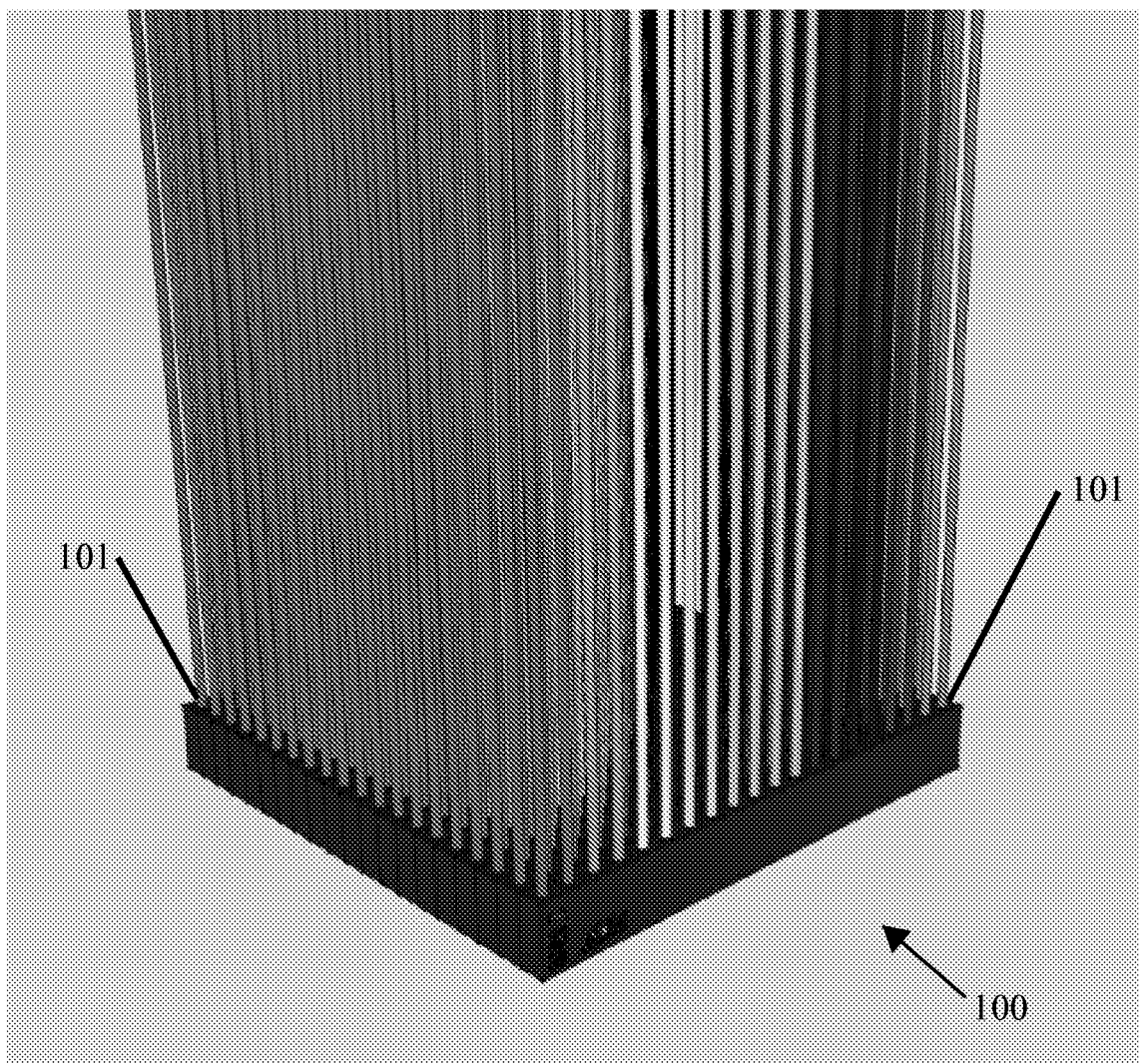
FIG. 5 is a two-dimensional array of lasers.
Figure 6:
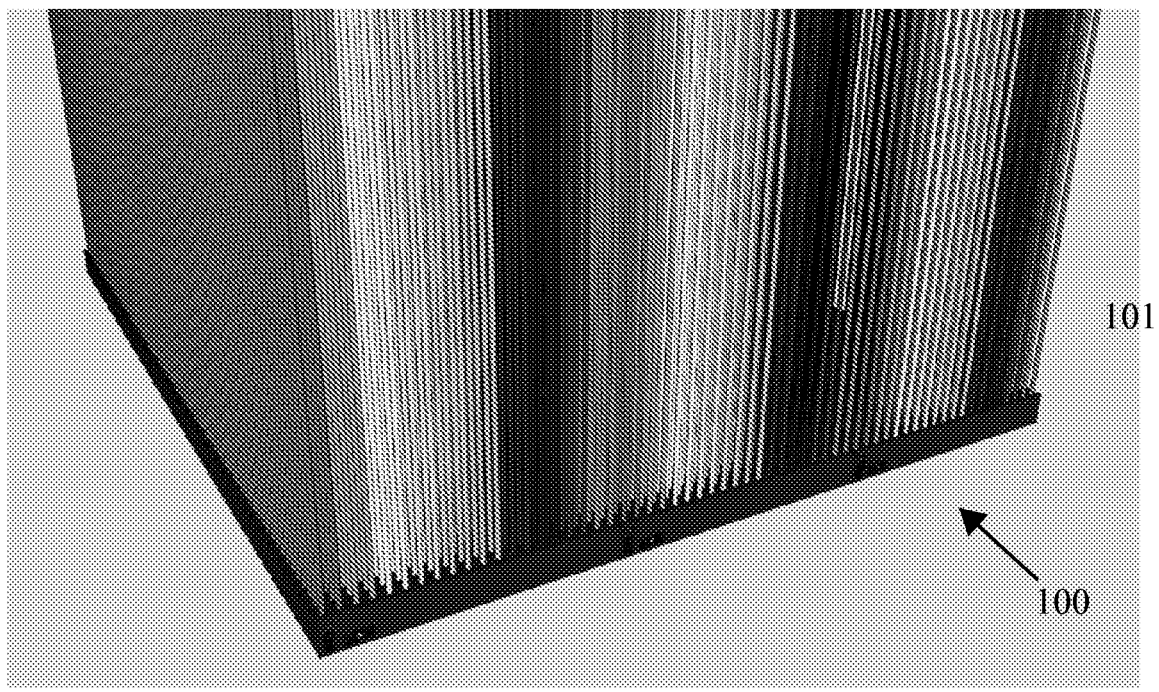
FIG. 6 is an alternate embodiment of a two-dimensional array of lasers.

FIG. 5 is a two-dimensional array 100 of laser elements 101. The array 100 can be a singular unit or it could comprise several linear arrays 100 arranged side-by-side. In the particular example shown in FIG. 5, twenty linear arrays 100 are placed next to each other, forming a low pitch and low resolution video screen. Given the modular nature and interconnectability of individual units, the arrays 100 are scalable to any size. FIG. 6 shows an example of a larger two-dimensional array 100 of roughly 3 by 4 meters. In this example, the resolution is 60×80 pixels, with each laser element 101 representing a pixel. Throughout this disclosure, the term "Lixel" is used to describe a pixel created by a laser element 101 in the array 100. Lixels may be monochomatic or polychromatic and Lixels can emit light within the visible or invisible electromagnetic spectrum, or a combination of both.

Figure 7:
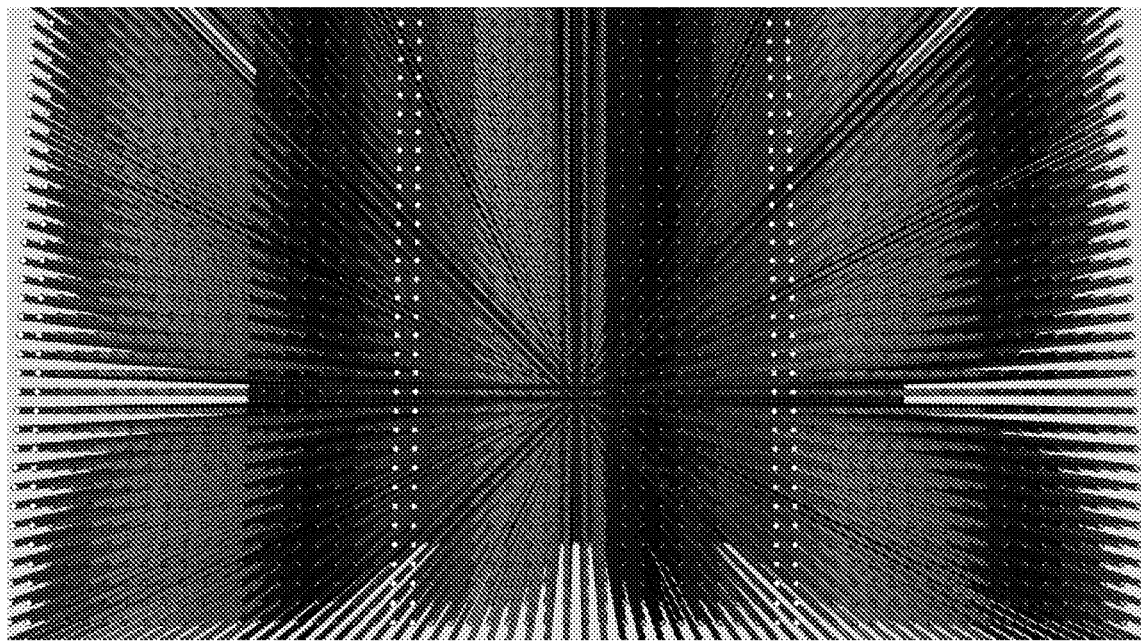
FIG. 7 is an alternate view of the embodiment of FIG. 6 from a perspective in-line with the laser output.
Figure 8:
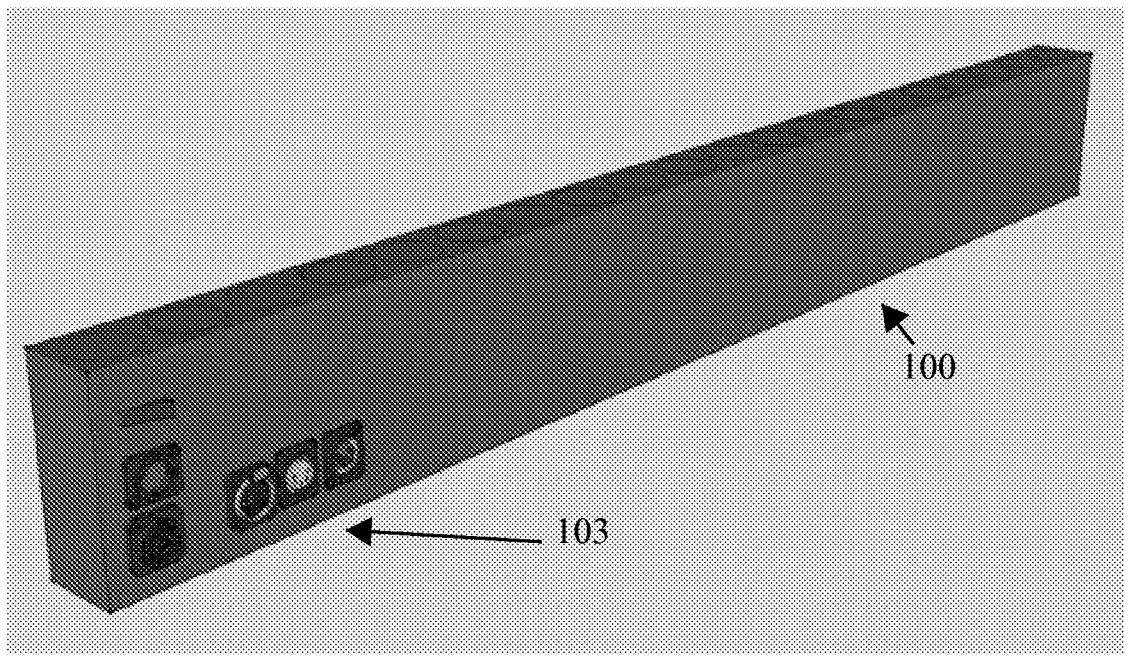
FIG. 8 is a view of a single linear array, without any light output visible.
Figure 9:
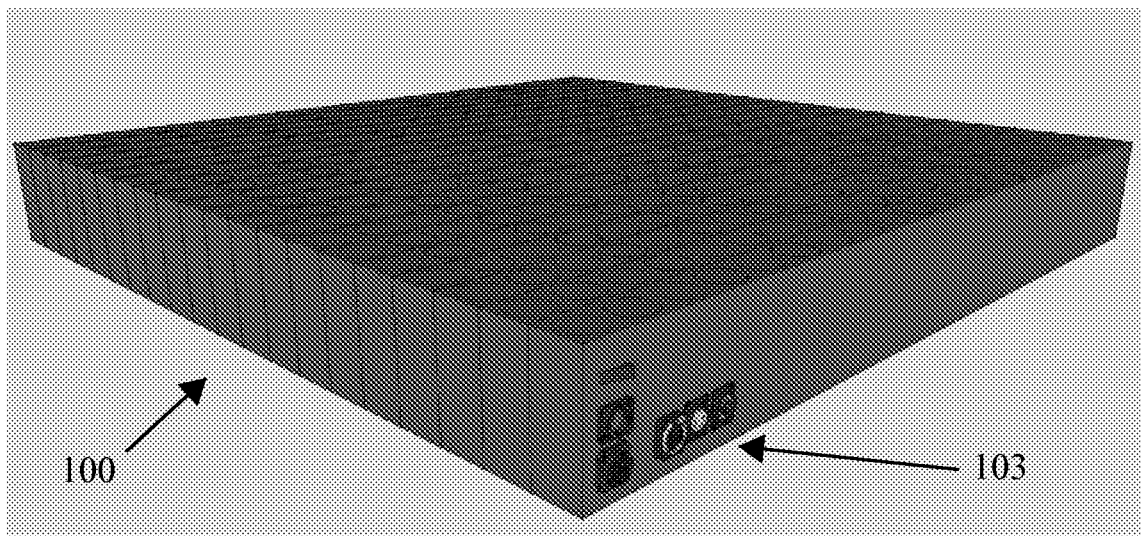
FIG. 9 is a two-dimensional array.
Figure 10:
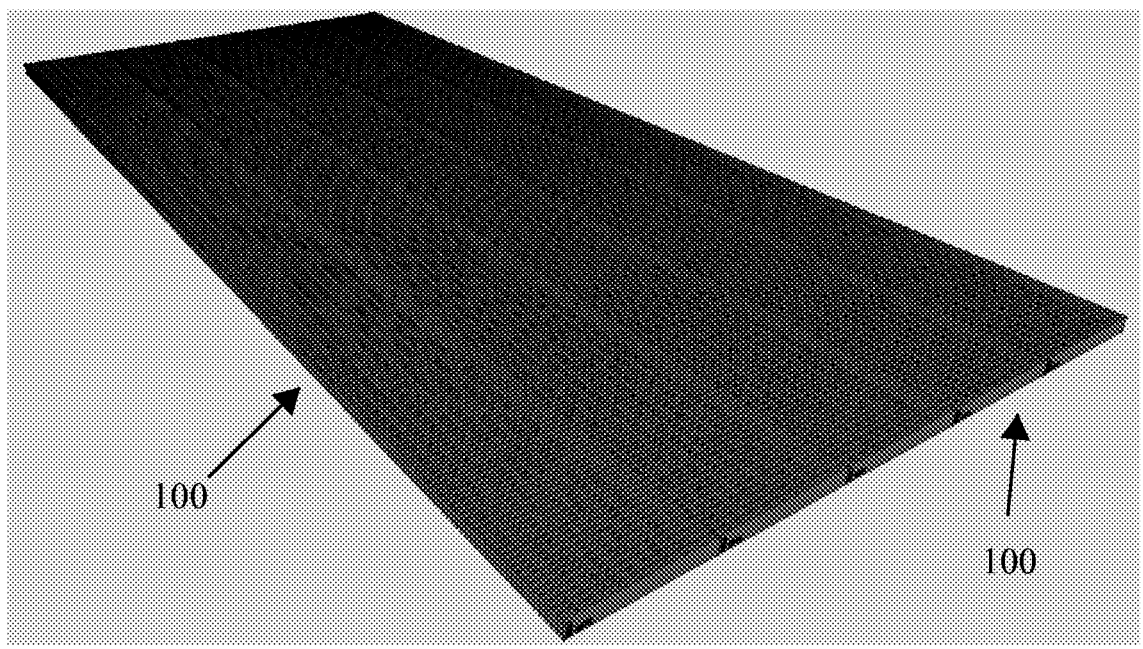
FIG. 10 is a two-dimensional array comprised of multiple individual arrays.

FIG. 7 shows an alternative view of the array 100 depicted in FIG. 6. Because lasers are point sources, rather than extended sources, the beam emanating from each Lixel is collimated in the preferred embodiment. So when a person views the laser array 100, the image can be presented as a three-dimension shape appearing at a distance from the array 100. This presentation is in stark contrast to the image created by a traditional video screen, where the image is flat. However, in alternative embodiments, each Lixel has an increased angular subtense to increase viewing safety. With a scaled array 100 of this size, a video can be displayed on the device. FIGS. 8-10 show the laser arrays 100 of varying sizes and shapes, according to different embodiments, without the laser light visible above the array 100.

When used as a Lixel array, the array 100 may be bitmap controlled on a Lixel by Lixel basis as to color mixing levels and intensity. Accordingly, beam profiles are sculpted and stationary or moving images are projected. In the case of a Lixel array, used in automotive headlights as an example, the Lixels are physically built into an array shape that matches the intended purpose. Each Lixel element is aimed at the intended location in the far field, eliminating the need for any global lenses as used with single point sources. Auto engineers struggle to produce a light that fits in the car, focuses on the road exactly where they want, and in intensities that they want. With the Lixel array, the light becomes a freeform construct. Moreover, certain objects in the field of view may be highlighted dynamically such as road signs, debris, wildlife, or other objects of interest.

Figure 21:
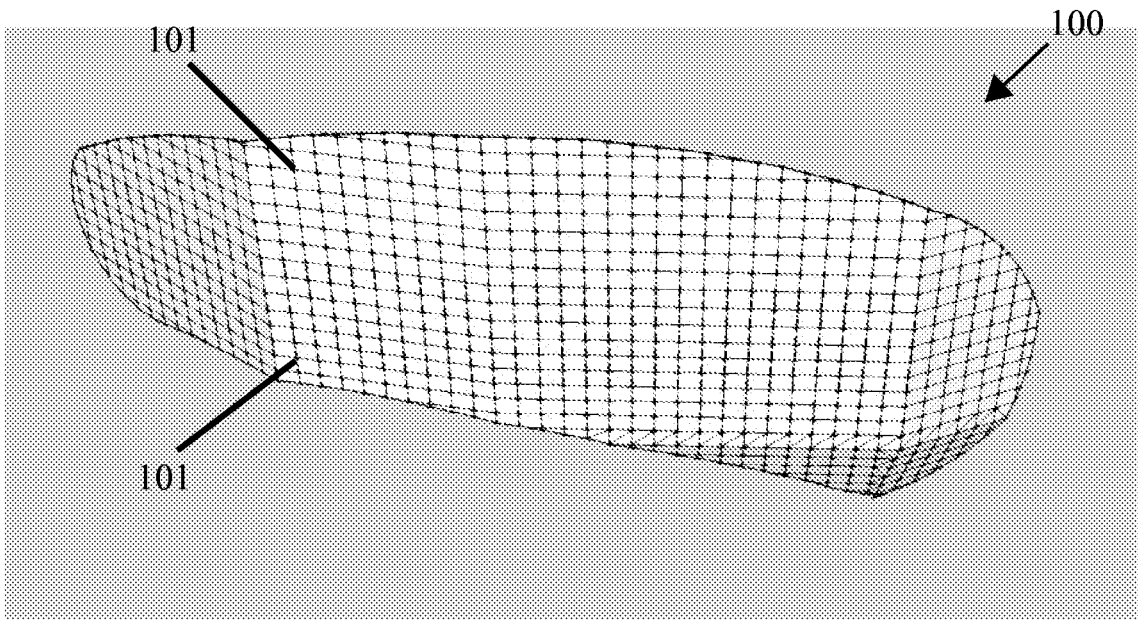
FIG. 21 depicts a non-planar embodiment of a laser array.

In the example of an automotive headlight, it is important to note that the array 100 is not bound to planar arrays. Shaping and directionality of the Lixels of the array 100 allow an exacting light profile to be created without the use of reflectors. An example of a non-planar embodiment is shown in FIG. 21.

The benefits of a Lixel array 100 used as a light source are as follows:
  Direct beam shaping by array,
  Incredibly sharp, focusable beam for other lighting uses,
  More directional than traditional light sources,
  Ability to use a beam with a higher irradiance than most light sources, and
  More efficient than LED light sources due to elimination of lossy reflectors.

Moreover, by combining different colored sources 102 in the array 100, a combined light source can be created. For example, red, green, and blue laser sources 102 can be combined to create a white laser light output. As a result, a laser array 100 could be used as a replacement for LED, Tungsten, and Florescent light sources that are typically used in home light bulbs, outdoor floodlights, street lights, spot lights, theatrical lights (PAR, Source 4, Spotlights, and moving yoke light, for example). Given the efficiency and power density of laser light sources, a 9000 W spotlight could be replaced by a 150 W laser source.

Figure 14:
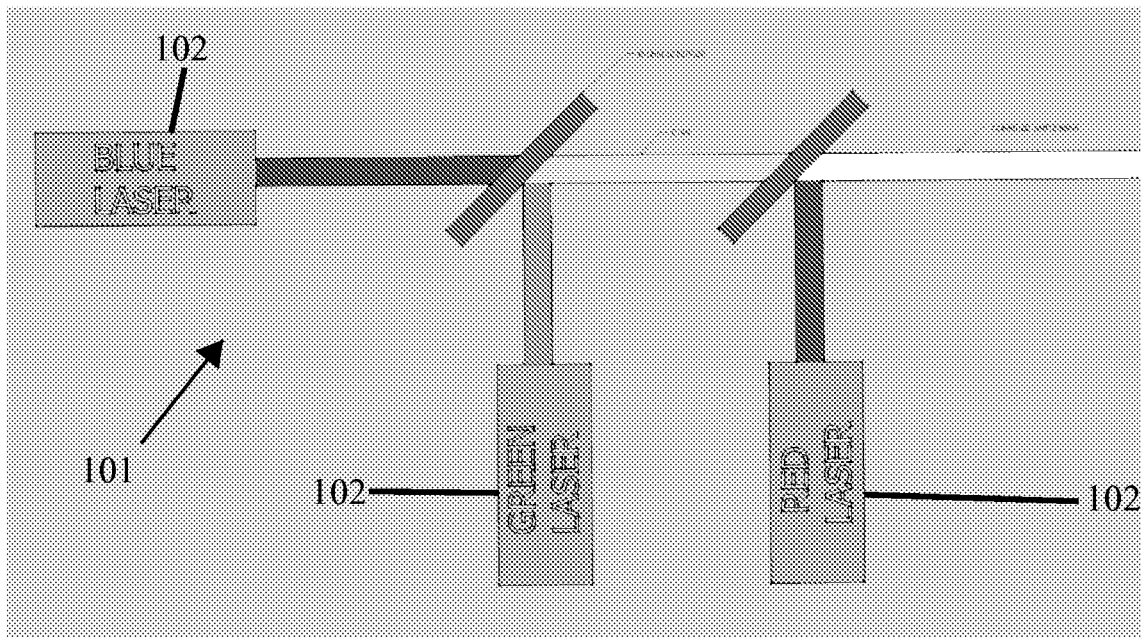
FIG. 14 is an example of combining different colors of laser light which could be arranged in an array, according to one embodiment.
Figure 15:
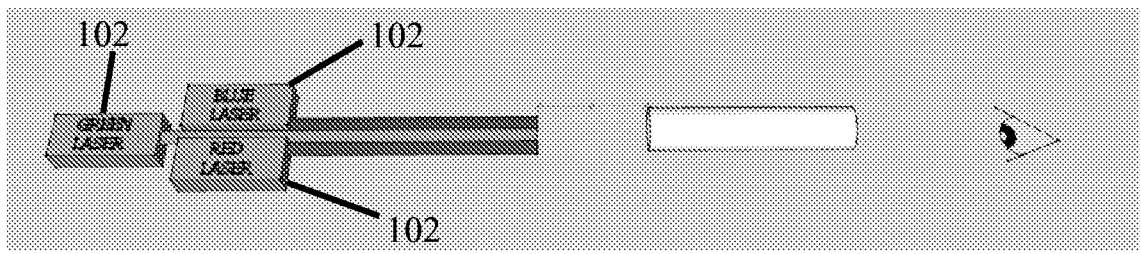
FIG. 15 is another example of combining different colors of laser light in an array.
Figure 16:
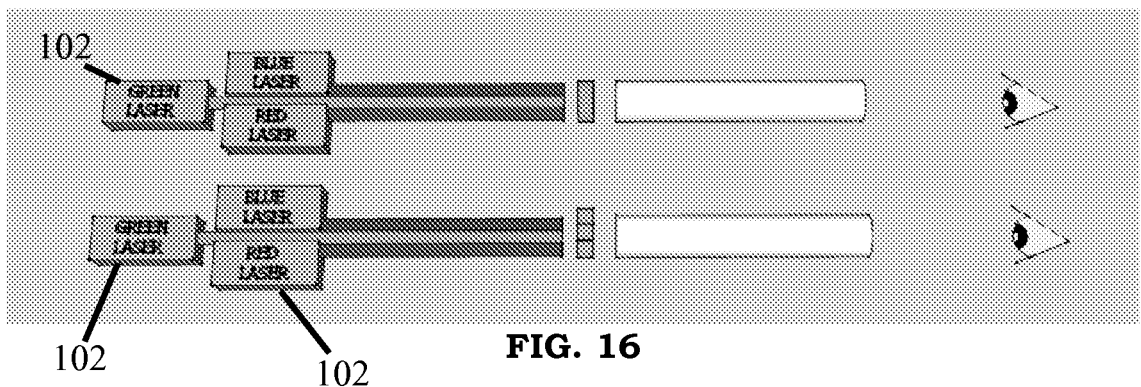
FIG. 16 is yet another example of combining different colors of laser light in an array.
Figure 17:
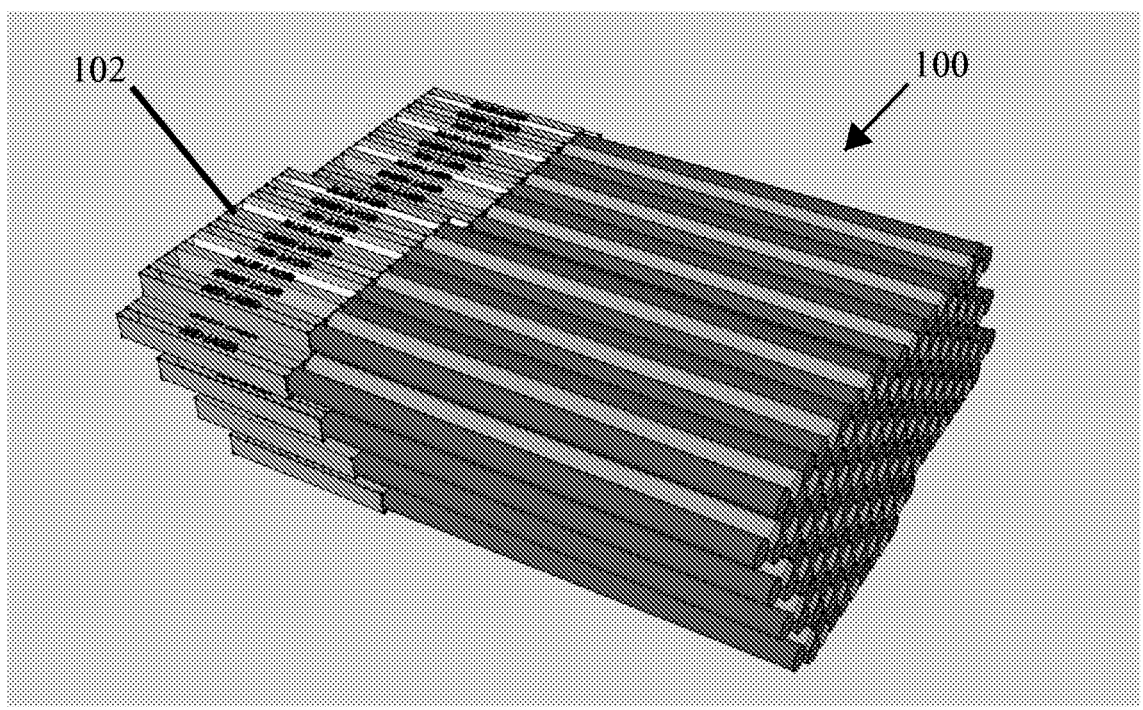
FIG. 17 is an example of lasers arranged in an array.
Figure 18:
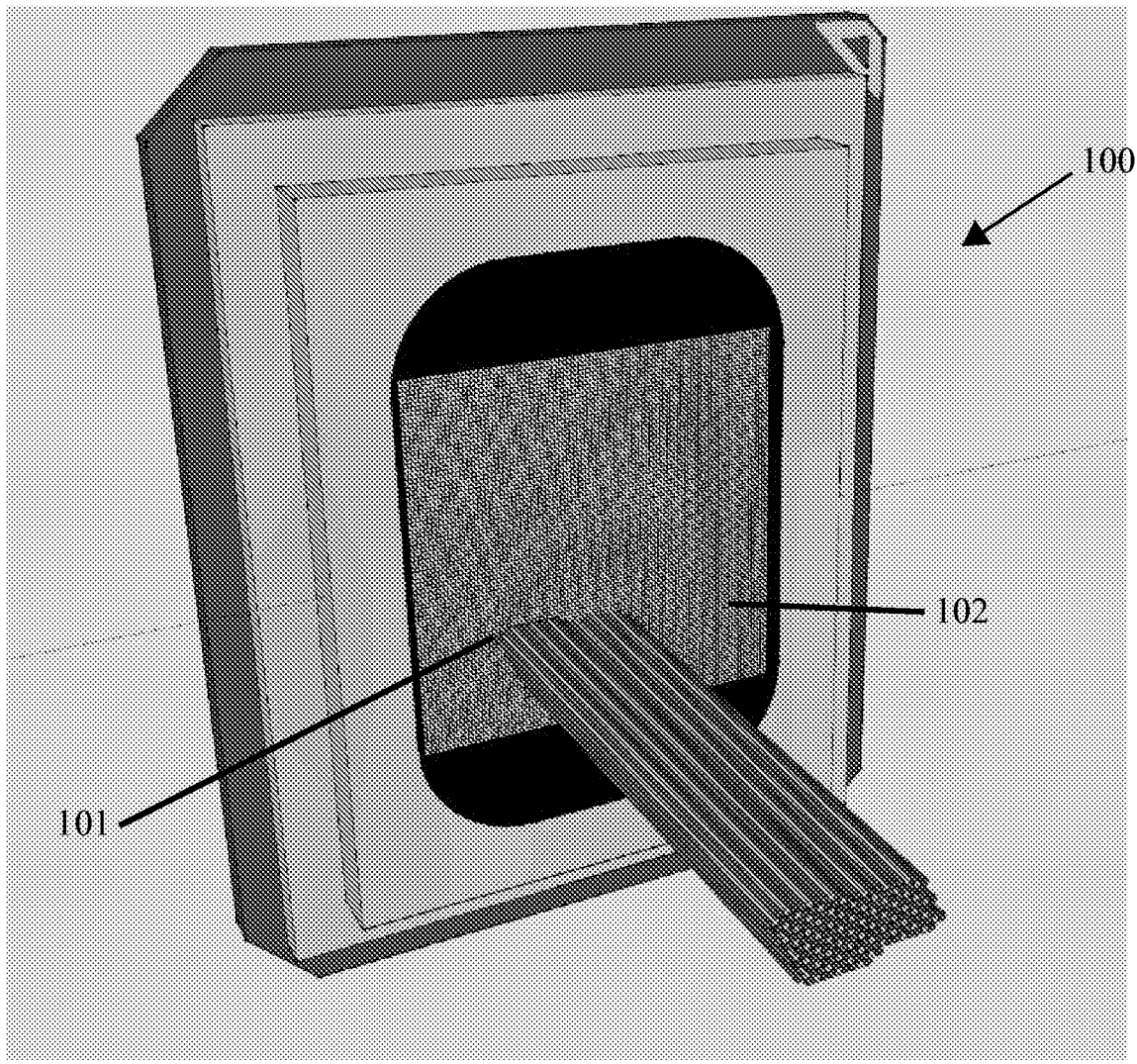
FIG. 18 is another example of lasers arranged in an array, according to an alternative embodiment.
Figure 19:
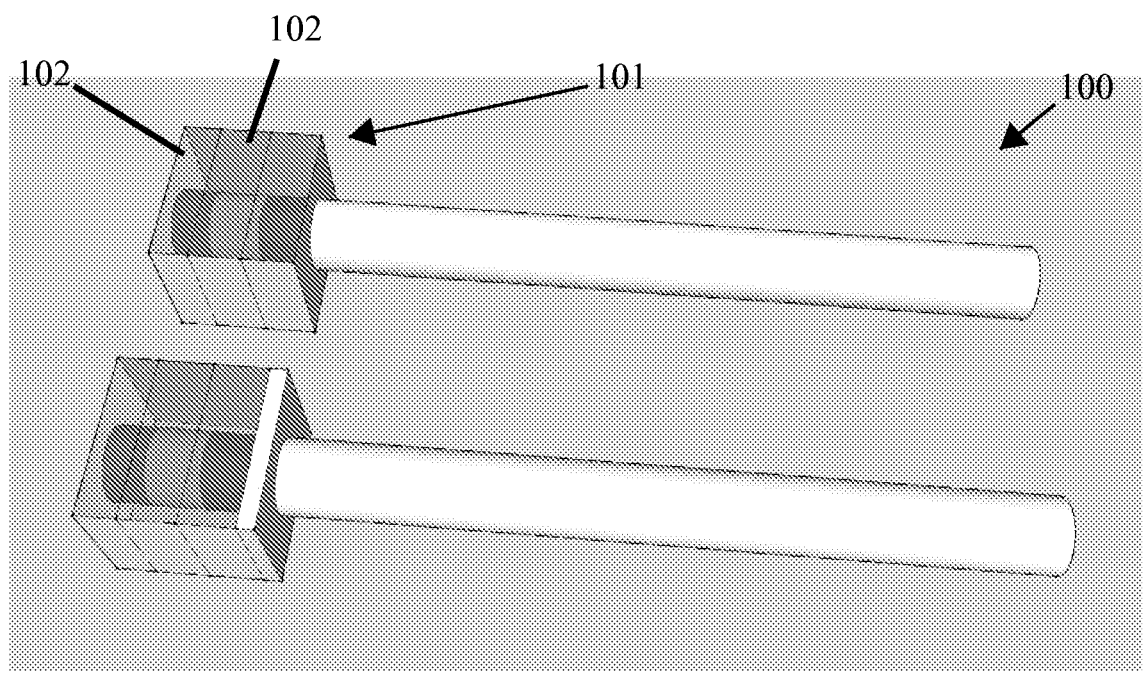
FIG. 19 is an alternative example of combining laser sources into a single beam of light.

Examples of various embodiments where several color laser sources 102 are combined to form white light are shown in FIGS. 14-19. In FIG. 14, three laser sources 102 are combined through the use of dichroic mirrors to form a combined beam. The laser sources 102 could be red, green, and blue, which would create a white combined beam. Other color lasers could be used depending on the desired output. Moreover, the power of each laser could be addressed such that the resulting combined beam is capable of displaying a range of colors. In this manner, the Lixel operates similar to a traditional pixel, where varying amounts of red, green, and blue light are combined to form a pixel of any color. FIG. 15 shows closely spaced laser sources 102, where the component wavelengths appear to merge from the perspective of a viewer at a given distance. To enhance the quality of a proximate combining method, a global lens that alters all beams simultaneously, or discrete lenses that alters the component beams individually, may be employed. Such a method is shown in FIG. 16. FIG. 17 shows a group of closely spaced Lixels, each Lixel having a red, green, and blue component. FIG. 18 shows a Lixel array comprising a semiconductor chip. In this embodiment, the semiconductor chip has several laser sources 102 102 of red, green, blue, or white on the same chip. FIG. 19 shows each color of a Lixel added sequentially before exiting as a combined beam.

To create one color temperature of white light, red, green, and blue laser sources 102 are combined in the ratio of 50% R @ 637 nm, 33% B @ 445 nm, and 17% G @ 532 nm. Other combinations of the three sources 102 create a combined output other than white. Sources 102 can be combined by dichroic filter methods (FIG. 14), prism methods, co-linear/proximate methods (FIGS. 15-16), or others to create coincident parallel beams. The combined laser beam from the sources 102 is up-collimated with optics to create a high diameter, low divergence beam. Though red, green, and blue is used as an example, the invention is not to be limited to these wavelengths. The present invention can use one or more wavelengths of visible or invisible light for output.

Costs will initially limit the size and resolution of Lixel arrays. The spacing of a pixel, or the pitch, of a screen determines the resolution or clarity of the projected image. Television screens and monitors, which are adapted for close viewing, tend to have smaller pitches than video screens viewed in a stadium. However, low pitch screens can often be found in use in the touring entertainment market, where 'gag' effects are commonly found. Low dot pitch laser arrays could be used to emulate fixtures such as the Krypton 25 (Element Series) lighting array. This traditional array is a simple grid of 5×5 halogen or krypton bulbs that are controlled independently. The spacing is approximately 4", and thus the device has a 4 inch pitch. A computer can be used to generate images on this very low resolution display when enough panels are connected edge to edge in horizontal rows, vertical rows, or typically in both directions.

Another analogy is the typical video wall used in touring productions and stage presentations. These video walls are quite advanced, often having a pitch of 2.0 mm or less, but with pitches commonly in the range of 2-20 mm. The most desirable and costly screens have an even lower dot pitch. For example, high end displays have higher density screens with a dot pitch of 0.025 mm. The screens are erected in modular panels that can attach endlessly in both directions. Each panel is capable of bearing the weight of the adjacent panels, and accordingly, screens up to many hundreds of feet wide are possible limited only by inventory and budget. A Lixel array having both low and high pitch densities that are compatible electrically and mechanically with conventional video wall panels could be used in the entertainment industry.

Referring again to the benefits of laser as light sources, each Lixel of the array 100 can be shaped. The emitter pattern can range from a low divergence, coherent laser dot, to a highly divergent and diffuse dot. Moreover, Lixels may be collimated through an optical telescope to control diameter and divergence and Lixels may have their coherence disturbed in order to achieve viewer eye safety at a lower divergence and/or closer distance. Adjustment of Lixel beam dynamics may be controlled by electrical (or other) actuated elements to control and shape the beam in any speed, in real time, with typical speeds matching video refresh speeds: 60 hz, 120 hz, 240 hz and faster.

Figure 11A:
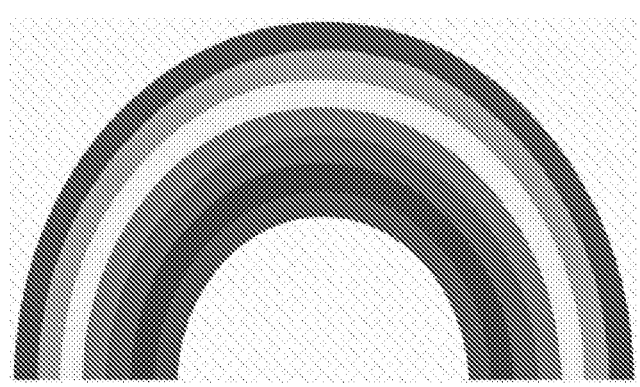
FIG. 11A is an image capable of being displayed on a traditional video screen.
Figure 11B:
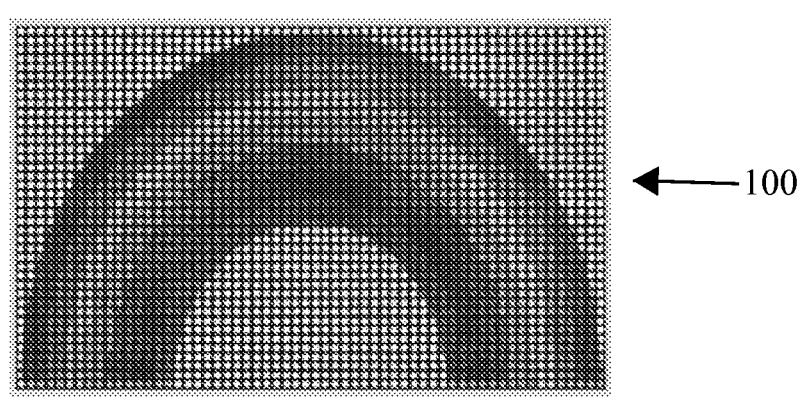
FIG. 11B is the same image as FIG. 11A, mapped to an array of lasers.
Figure 12:
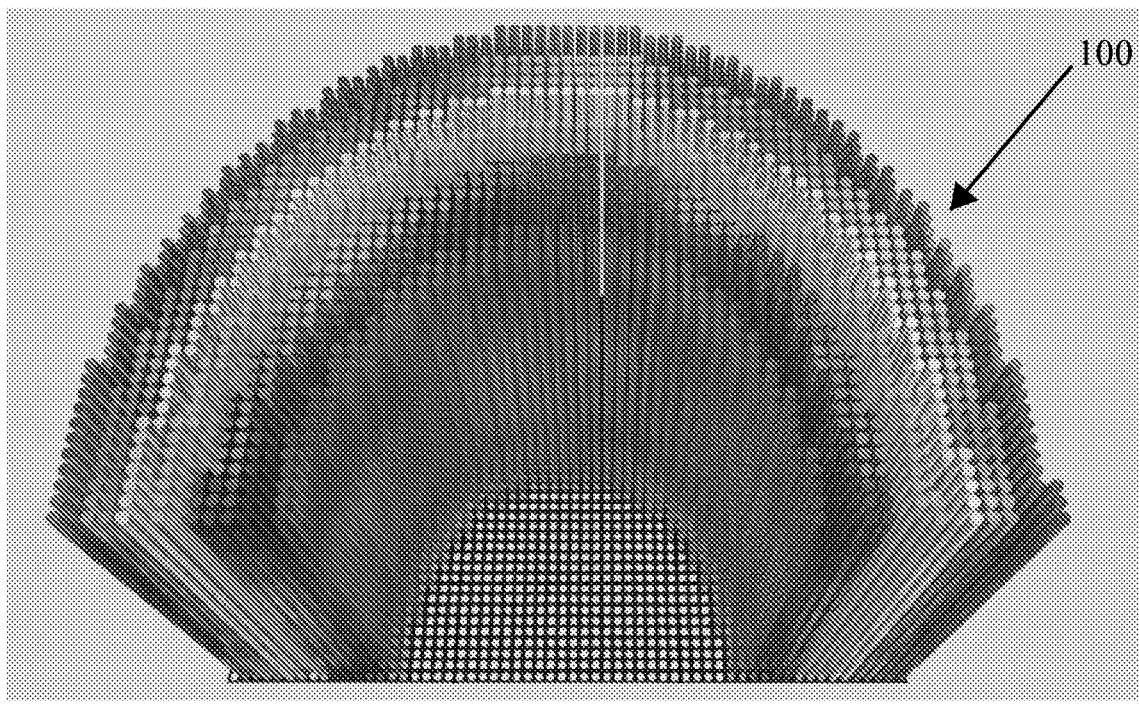
FIG. 12 is a simulated view of the image displayed on an array of lasers.

FIGS. 11A and 11B shows examples of how a laser array 100 could be used as a video screen. FIG. 11A shows a sample image mapped into a grid pattern, with each grid representing a pixel. FIG. 11B shows the same image, with each grid representing an individual laser element 101 in the array 100. The X, Y, Brightness, red, green, and blue data are mapped to the Lixels in the same manner as they would be mapped to pixels. Because of the collimated nature of laser light, the image projected by the laser array 100 is not bound to the two-dimensional surface of the array 100. Rather, the image extends continuously from the surface and propagates for a distance, depending on the quality and nature of the laser light. In other words, each Lixel element may exit the array as a collimated laser beam if the Lixel is programmed as such. FIG. 12 is a depiction of the sample image projected from the surface of the array 100. The viewer may be directly inside the projected image. However, the images projected by the laser array can be animated such that three-dimensional shapes move around and over the viewers. For example, a sheet or plane of horizontal light can travel from the bottom of a laser array 100 to the top of the array by sequencing the illumination of horizontal groups of Lixels.

Figure 13:
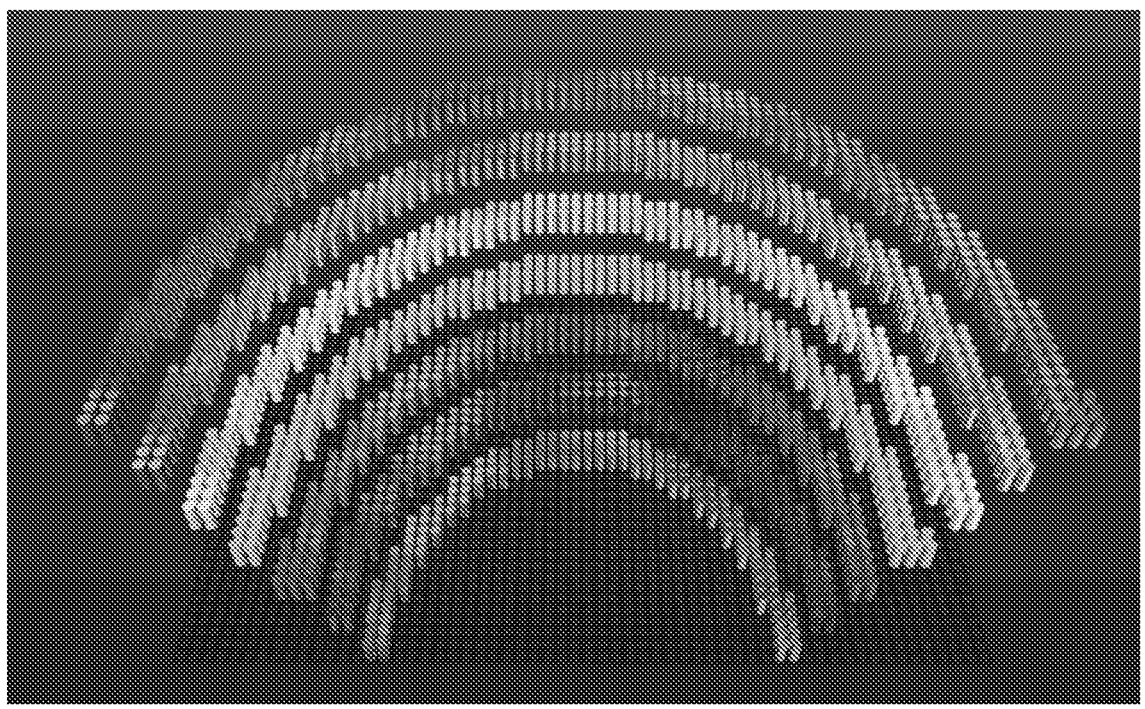
FIG. 13 is another simulated view of the image, where various parameters of the laser light are manipulated to create a three-dimensional image.

As another example of the effects that can be created by a laser array 100, FIG. 13 shows the image when other dimensions are manipulated. For example, setting the depth (or Z-depth) of the image by commanding the position of the waist beam allows the control of light solids in three-dimensional space. Not only is this effect visually appealing for entertainment, advertising, and consumer displays, but this feature could also be used for visualizing complex data sets.

Another benefit of a laser array 100 in the entertainment touring industry, or in other uses, is the elimination of flicker. In typical laser projection systems, a single laser is used with a scanner to deflect the beam. By moving the beam and controlling the color at given points in time, a method of time division allows the creation of shapes. This method is limited because the image appears from a single source and diverges in a cone-shaped geometry as the distance from the source increases. In addition, the maximum size of a projected shape is limited to the tangent of the maximum scan angle multiplied by the distance to the screen or observer. With a laser array 100, each position having an X, Y, and Z coordinate is represented by one Lixel, meaning time division is not required to share the laser beam at any point in space. The result is no flicker and the elimination of a maximum size of projected image.

Other benefits of a laser array 100 will be discussed. For example, LED or other light source elements can be intermixed with the Lixels of an array to facilitate the simultaneous projection of flat video and dynamic Lixel content that extends beyond the screen, create extruded midair sculptures, and directly engage the audience.

Lixels may be steerable. A typical Lixel propagates a beam perpendicular to its mounting surface, but external electrical or mechanical elements may steer the direction of the Lixel beam.

Lixels may have individually controllable polarization per element, allowing for a 4th dimension (extruded 3D physically, additional implied dimension via common polarized viewing elements such as active or passive polarized glasses.)

Attributes of the projection data may be paired with Lixel beam quality. For example, color data might be interpreted by an external processor in order to dynamically change beam focus, polarization, or intensity.

External data sources may make use of Lixel beam properties to visualize data sets requiring more than two dimensional data. Since a laser is highly controllable and shapeable, the laser array can take advantage of these attributes for the visualization of data. For example, each vector stored in a Lixel can include:

Color component values Red, Green, and Blue (R G B) in a scale from 0-100%. These primary colors represent basic color mixing.

Brightness is included by reference with R G B level control. Any brightness of any color may be achieved.

Focus or Z-Depth: By attaching an electrically focusable lens to each Lixel, the location of the waist beam can be controlled in space. That is, the beam will reduce from a fat area to a thin area and then back to fat again. The beam will be highly concentrated at this waist or focus position. By manipulating the Z-Depth at the same speed as the other elements, a three dimensional "Light Solid" is created.

X&Y coordinates are created by determining which elements, or Lixels, are activated.

Polarization: A Lixel may be comprised of sources with both horizontal and vertical polarized laser sources. In an alternative embodiment, the array uses a polarization modifying optical element such as a common 'polarization rotator' which is electrically controlled for each Lixel. By altering the polarization as a function of time, an additional dimension is created. A viewer with polarization sensitive eyewear can have separate images, or altered images, presented to each eye. This can project selective data by filtering it from the display, or it can create three-dimensional content.

Time: Each Lixel is independently controllable for the period of time in which it is emitting a beam. This time could indicate a data parameter in the visualization, or it may be timed to match the refresh rate of LCD shuttered eyewear as is common in active 3D television glasses. An embodiment of the technology allows an extra depth of 3D, or a method of selectively refreshing actual Light Solids 3D content to each eye.

Beam Diameter: Using the same hardware as the Z-Depth, by extending the travel of the focal device, the beam size may be manipulated in real time to each Lixel element.

Scan Speed: One embodiment of the Lixel uses a scanning element to achieve safety. A laser beam ½ the diameter of the aperture orbits the central axis of the aperture. The speed is variable, and may be used to create persistence of vision that appears as a solid to the viewer. However, the movement of the beam creates a minimum angular velocity and dwell time that permits direct ocular viewing.

Lixel Orientation: A Lixel may have up to three degrees of rotation, and three degrees of freedom. Accordingly, up to 6 additional data points may be stored for each Lixel. An example would include Lixels with a simple X/Y rotation that enables the direction of emission for the Lixel to change dynamically with the input signal.

So at any point, any one Lixel has the independent ability to have the following variables, or display vectors, simultaneously controlled: Red Intensity, Green Intensity, Blue Intensity, and additional primary color Intensities, Brightness, Focus or Z-Depth, Polarization, Time, Beam Diameter, Scan Speed, and Lixel Orientation, without limitation. The streaming or static input content will dictate which Lixel elements receive the content, which are the X&Y positions active in the Lixel Array.

The projection of complex data might be compared to a signal feeding a television display. Red, Green, and Blue are sending separate intensity values for the entire screen array at any given time. In the advanced Lixel displays, additional 'layers' or data are also being sent.

Such additional lasers allow a Lixel screen to use the 3D volume in front of the screen to simultaneously communicate many complex variables. This will allow the visualization of many complex data sets such are found in scientific and medical disciplines. Additionally, it will create opportunities for entertainment and visual displays using this additional 'deep variables' Home appliances, interaction with devices and the environment, and advertising will all benefit from these complex 'real-world, real-3D' display devices.

The Lixel embodiment can be an individual element with these properties and a collection of Lixels in orderly and/ or organic arrangements. Such arrays may be linear (strip), two dimensional (flat X/Y array), or three dimensional. (X/Y/Z array).

Multiple Lixel types 'personalities' may be combined within one collection of Lixels as necessary to visualize the appropriate data.

Figure 20:
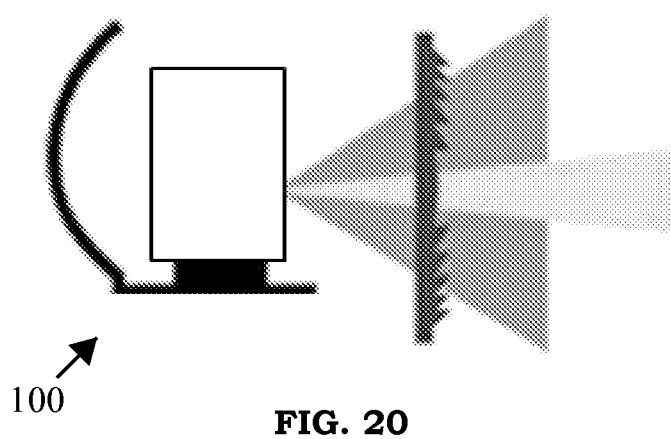
FIG. 20 is an embodiment of a laser array used with a Fresnel lens.

The laser arrays 100 can be useful in replacing traditional lighting sources. A typical theatrical Fresnel light housing is illustrated in FIG. 20. These fixtures make use of conventional light sources such as tungsten, arc lamps of several varieties, HID discharge, and even LED. In the embodiment shown in FIG. 20, these conventional light sources are replaced with a laser light source.

Red, green, and blue laser sources are combined to form a white combined beam. The white beam passes through an optical telescope assembly, compound if necessary, to achieve desired beam size and profile, to produce an initial beam diameter which is compatible with the fixture body diameter. It is also possible to use Lixel arrays that have a much larger initial beam diameter than directly combined laser beams or even an array that is equal in size to the fixture body diameter, or even the final projected diameter. Beams that are smaller than the far field projection diameter may pass through an optical telescope. Adjustment of the optical telescope permits adjustment of the far-field beam size. Mechanical stops may be incorporated to prohibit the user from creating a converging focus output which would introduce unwanted high power densities.

Some amount of beam degradation may be introduced to allow for eye safety including, but not limited to: increased divergence, reduced power, polarization, reduction of coherence, reduction of directionality, or introduction of diffusive or other disruptive optical elements. The amount of optical degradation may be adjustable. For example, purposefully introducing 'contaminants' (or enhancements) into one or more layers of the solid state semiconductor laser could be used to degrade the beam quality, removing the laser source from the purview of FDA regulation. In other words, the laser beam could be disturbed sufficiently for the laser source to qualify as a traditional light source, rather than a laser source.

It must be noted that the fixture requires no focus. The light source has infinite focus due to the laser sources. However, in the case of the Fresnel embodiment, it would be desirable to emulate current zoom angles as are currently available. For example, many fixed zoom lens attachments are available such as 20 degrees or 40 degrees. Some have a user selectable zoom which may be manually adjusted within a range such as 60-80 degrees. A fixed zoom fixture would be optimized for the brightest safe output within the projected far-field area. This would essentially be the maximum brightness, or irradiance, allowed by law.

In replacing traditional light sources, the laser array 100 can be located in traditional fixtures. For example, the laser array shown in FIG. 20 can be placed in a moving yoke. In this example, multiple parameters may be controlled by DMX, ArtNet, or other industry standard control. Basic functions without limit are: pan, tilt, iris, zoom, shutter, framing, color mixing, color correction (CTO), gobo select, gobo index, gobo rotate, prism, frost, effects wheels, focus, polarization, directionality, and bitmapped control of lixel elements. A safety system may be incorporated to allow fixture velocity and the movement of physical functions listed previously without limit to increase fixture brightness dynamically. Movement of a fixture or components of the fixture reduces the viewer's eye exposure time and allows for improved brightness and beam characteristics.

Using the bitmapped function of the laser array 100, by projecting shapes at less than 100 percent of the array elements, also allows the safety system to increase brightness. The safety system may also use yoke position information to create a user defined map with no viewer access, and to increase brightness and beam characteristics in those areas. The safety system may also make use of sensors or environmental markers to define areas of high and low power output that correspond to unoccupied or occupied viewer areas. The safety system may be aware of user control inputs that create hazardous beams, and prevents such conditions. The system may incorporate mechanical limits to intrinsically prevent unsafe output, such as stops on the safe zoom extents.

A light source utilizing a laser array 100, such as shown in FIG. 20, will benefit from a lighter design, since the arc lamp power supply is eliminated. For the moving yoke example, the fixture responds to controls more accurately since there is less mass to move. In addition, the reduction of suspended weight in overhead lighting reduces materials and engineering costs. Other benefits include more rugged design with no bulbs to break. Increased consistency since laser diodes maintain output and color temperature over full lifetime. Traditional bulbs shift color temperature as they age and require replacement prior to failure for aesthetic purposes.

Figure 22:
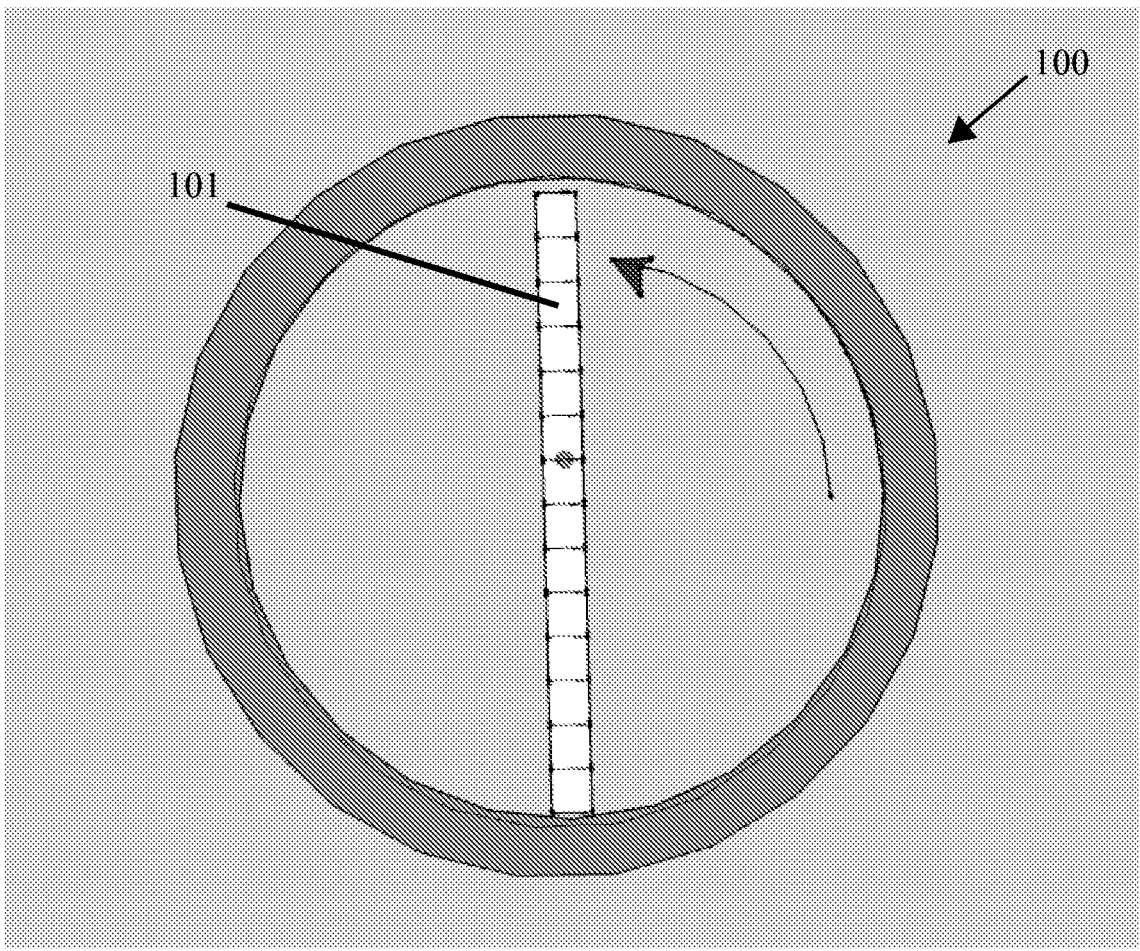
FIG. 22 is a rotating laser array embodiment.

An additional example of replacing a traditional light source with a laser array 100 is shown in FIG. 22. In this example, the laser array 100 is rotating to control maximum exposure values using a variable time constant instead of continuous exposure constants. This embodiment allows a much brighter output while maintaining safety.

While the disclosure has been described in detail and with reference to specific embodiments thereof, it will be apparent to one skilled in the art that various changes and modifications can be made therein without departing from the spirit and scope of the embodiments presented. Thus, it is intended that the present disclosure cover the modifications and variations of this disclosure provided they come within the scope of the appended claims and their equivalents.

What is claimed is:

1. A laser array for projecting an image, comprising:
    a first laser element comprising a plurality of laser sources and forming a single pixel in the laser array,
        wherein the plurality of laser sources of the first laser element are combined to form a collinear first element output beam,
        wherein a parameter of each laser source of the plurality of laser sources can be adjusted to manipulate the first element output beam,
        wherein an angle of the first element output beam exiting the first laser element remains static after exiting the first laser element until exiting the laser array;
    at least one additional laser element comprising a plurality of laser sources and forming an additional single pixel in the laser array,
        wherein the plurality of laser sources of the at least one additional laser element are combined to form a collinear additional laser output beam positioned at a distance from the first laser element to form a pattern of laser elements,
        wherein a parameter of each laser source of the plurality of laser sources can be adjusted to manipulate the additional laser element output beam,
        wherein an angle of the additional laser output beam exiting the additional laser element remains static after exiting the additional laser element until exiting the laser array;
    a control interface,
        wherein the first laser element and the at least one additional laser element are operably connected to the control interface,
        wherein the parameter of each laser source of the plurality of laser sources is addressable through the control interface to individually modulate each pixel in the laser array;
    wherein each of the first element output beam and the additional laser element output beam are separate beams exiting the laser array parallel to each other and have a focus approaching infinity.

2. The laser array of claim 1, wherein an orientation of laser elements forms a linear array.

3. The laser array of claim 1, wherein an orientation of laser elements forms a two-dimensional array.

4. The laser array of claim 1, wherein an orientation of laser elements forms a three-dimensional array.

5. The laser array of claim 4, wherein the three-dimensional array has multiple contours.

6. The laser array of claim 1, wherein the plurality of laser sources forming the first laser element is selected from a group consisting of: a red diode laser; a green diode laser; a blue diode laser; a multi-wavelength laser; and a white output laser.

7. The laser array of claim 1, wherein the plurality of laser sources of the first laser element is combined within the first laser element with dichroic mirrors to form the first element output beam.

8. The laser array of claim 1, wherein the plurality of laser sources of the first laser element is combined within the first laser element with a prism to form the first element output beam.

9. The laser array of claim 1, wherein each laser source of the plurality of laser sources of the first laser element is located proximate an adjacent laser source of the plurality of laser sources.

10. The laser array of claim 1, wherein the parameter of each laser source of the plurality of laser sources is selected from a group consisting of:
    intensity, brightness, focus, Z-depth, polarization, time, beam diameter, scan speed, and orientation.

11. The laser array of claim 1, wherein the parameter of each laser source of the plurality of laser sources is adjusted independently.

12. The laser array of claim 1, wherein the plurality of laser sources of the first laser element are collinear.

13. The laser array of claim 1,
    wherein the first element output beam is not manipulated after exiting the first laser element; and
    wherein the additional output beam is not manipulated after exiting the additional laser element.

14. A method of controlling the laser array comprising:
    providing a first laser element comprising a plurality of laser sources and forming a single pixel in the laser array,
        wherein the plurality of laser sources of the first laser element are combined to form a collinear first element output beam,
        wherein an angle of the first element output beam exiting the first laser element remains static after exiting the first laser lement until exiting the laser array,
    adjusting a parameter of each laser source of the plurality of laser sources to manipulate the first element output beam using a control interface;
    providing at least one additional laser element positioned at a distance from the first laser element to form an additional pixel in the laser array,
        wherein the at least one additional laser element has an additional collinear laser element output beam,
        wherein an angle of the additional laser element output beam exiting the additional laser element remains static after exiting the additional laser element until exiting the laser array, and
    adjusting a parameter of each laser source of the plurality of laser sources to individually modulate a pixel generated by each of the first laser element and the at least one additional laser element,
        wherein each of the first element output beam and the additional laser element output beam are separate beams exiting the laser array parallel to each other and have a focus approaching infinity.

15. A laser array for projecting an image, comprising:
a first laser element comprising a plurality of laser sources and forming a single pixel in the laser array,
  wherein the plurality of laser sources of the first laser element are combined to form a collinear first element output beam,
  wherein a parameter of each laser source of the plurality of laser sources can be adjusted to manipulate the first element output beam,
  wherein an angle of the first element output beam exiting the first laser element remains static after exiting the first laser element without passing through optical elements, lenses, or mirrors before exiting the laser array;
at least one additional laser element comprising a plurality of laser sources and forming an additional single pixel in the laser array,
  wherein the plurality of laser sources of the at least one additional laser element are combined to form a collinear additional laser output beam positioned at a distance from the first laser element to form a pattern of laser elements,
  wherein a parameter of each laser source of the plurality of laser sources can be adjusted to manipulate the additional laser element output beam,
  wherein an angle of the additional laser output beam exiting the additional laser element remains static after exiting the additional laser element without passing through optical elements, lenses, or mirrors before exiting the laser array;
a control interface,
  wherein the first laser element and the at least one additional laser element are operably connected to the control interface,
  wherein the parameter of each laser source of the plurality of laser sources is addressable through the control interface to individually modulate each pixel in the laser array;
wherein each of the first element output beam and the additional laser element output beam are separate beams exiting the laser array parallel to each other and have a focus approaching infinity.

16. The laser array of claim 15,
wherein the first element output beam is not manipulated after exiting the first laser element; and
wherein the additional output beam is not manipulated after exiting the additional laser element.

* * * * *